(12) United States Patent
Hougham et al.

(10) Patent No.: US 9,040,841 B2
(45) Date of Patent: May 26, 2015

(54) AXIOCENTRIC SCRUBBING LAND GRID ARRAY CONTACTS AND METHODS FOR FABRICATION

(75) Inventors: Gareth Hougham, Yorktown Heights, NY (US); Gerard McVicker, Yorktown Heights, NY (US); Xiaoxiong Gu, Yorktown Heights, NY (US); Sung K. Kang, Yorktown Heights, NY (US); Frank R. Libsch, Yorktown Heights, NY (US); Xiao H. Liu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 244 days.

(21) Appl. No.: 13/604,363

(22) Filed: Sep. 5, 2012

(65) Prior Publication Data

US 2012/0325541 A1    Dec. 27, 2012

Related U.S. Application Data

(62) Division of application No. 12/614,224, filed on Nov. 6, 2009, now Pat. No. 8,263,879.

(51) Int. Cl.
| | |
|---|---|
| H05K 1/11 | (2006.01) |
| H05K 3/40 | (2006.01) |
| H01R 12/70 | (2011.01) |
| H01R 12/71 | (2011.01) |
| H01R 13/24 | (2006.01) |
| H05K 3/32 | (2006.01) |

(52) U.S. Cl.
CPC .......... *H05K 3/4092* (2013.01); *H01R 12/7082* (2013.01); *H01R 12/714* (2013.01); *H01R 13/2414* (2013.01); *H01R 13/2421* (2013.01); *H05K 3/326* (2013.01); *H05K 2201/0311* (2013.01); *H05K 2201/10265* (2013.01); *H05K 2201/10378* (2013.01)

(58) Field of Classification Search
USPC ............ 174/261; 361/760; 439/66, 82, 620.1; 216/18
See application file for complete search history.

(56) References Cited

U.S. PATENT DOCUMENTS

| | | | |
|---|---|---|---|
| 4,505,529 A | 3/1985 | Barkus | |
| RE34,084 E | 9/1992 | Noschese | |
| 5,297,967 A * | 3/1994 | Baumberger et al. | ........... 439/66 |
| 5,366,380 A | 11/1994 | Reymond | |

(Continued)

*Primary Examiner* — Xiaoliang Chen
(74) *Attorney, Agent, or Firm* — Scully, Scott, Murphy & Presser, P.C.; Daniel P. Morris, Esq.

(57) ABSTRACT

A contact structure and assembly and a method for manufacturing the same for a microelectronics device includes first and second electrically conductive contacts being helically shaped. A carrier element is attached to and positioned between the first and second contacts. The first and second contacts are in electrical communication with each other, and the first and second contacts are in a mirror image relationship with each other. A pair of insulating substrates each include electrically conductive members. A contact point on each of the first and second contacts is attached and electrically communicating to respective electrically conductive members such that the first and second electrically conductive contacts between the pair of insulating substrates form an electrically conductive package. A metal layer on the carrier element provides electrical conductivity through a first opening defined by the carrier element between the first and second portions of the helix shaped contact.

16 Claims, 10 Drawing Sheets

(56) References Cited

U.S. PATENT DOCUMENTS

| | | | |
|---|---|---|---|
| 5,590,460 A | 1/1997 | DiStefano et al. | |
| 5,957,703 A | 9/1999 | Arai et al. | |
| 6,007,349 A | 12/1999 | Distefano et al. | |
| 6,110,823 A | 8/2000 | Eldridge et al. | |
| 6,190,181 B1 | 2/2001 | Affolter et al. | |
| 6,200,141 B1 | 3/2001 | Sinclair | |
| 6,239,386 B1 | 5/2001 | DiStefano et al. | |
| 6,266,874 B1 | 7/2001 | DiStefano et al. | |
| 6,274,820 B1 | 8/2001 | DiStefano et al. | |
| 6,290,507 B1 | 9/2001 | Neidich et al. | |
| 6,315,576 B1 | 11/2001 | Neidich | |
| 6,336,269 B1 | 1/2002 | Eldridge et al. | |
| 6,390,826 B1 | 5/2002 | Affolter et al. | |
| 6,409,521 B1 | 6/2002 | Rathburn | |
| 6,442,039 B1 * | 8/2002 | Schreiber | 361/760 |
| 6,558,560 B2 * | 5/2003 | Clements et al. | 216/18 |
| 6,672,876 B1 | 1/2004 | Takekoshi | |
| 6,719,569 B2 | 4/2004 | Ochiai | |
| 6,722,893 B2 | 4/2004 | Li et al. | |
| 6,730,134 B2 | 5/2004 | Neidich | |
| 6,784,378 B2 | 8/2004 | Zhu et al. | |
| 6,916,181 B2 * | 7/2005 | Brown et al. | 439/66 |
| 6,974,332 B2 | 12/2005 | Ma | |
| 7,137,827 B2 * | 11/2006 | Hougham et al. | 439/66 |
| 7,254,889 B1 | 8/2007 | Cherian | |
| 7,263,771 B2 | 9/2007 | Ochiai | |
| 7,331,796 B2 * | 2/2008 | Hougham et al. | 439/66 |
| 7,383,632 B2 | 6/2008 | Dittmann | |
| 7,449,910 B2 | 11/2008 | Kirby et al. | |
| 7,452,212 B2 * | 11/2008 | Hougham et al. | 439/66 |
| 7,491,069 B1 | 2/2009 | Di Stefano et al. | |
| 7,527,505 B2 | 5/2009 | Murata | |
| 7,559,770 B2 * | 7/2009 | Di Stefano | 439/66 |
| 7,648,369 B2 * | 1/2010 | Hougham et al. | 439/66 |
| 7,832,095 B2 | 11/2010 | Hougham et al. | |
| 8,029,291 B2 | 10/2011 | Park | |
| 8,207,604 B2 | 6/2012 | Haba et al. | |
| 8,263,879 B2 | 9/2012 | Hougham et al. | |
| 2001/0020545 A1 | 9/2001 | Eldridge et al. | |
| 2001/0020546 A1 | 9/2001 | Eldridge et al. | |
| 2002/0117330 A1 | 8/2002 | Eldridge et al. | |
| 2003/0003784 A1 | 1/2003 | Neidich | |
| 2003/0099097 A1 | 5/2003 | Mok et al. | |
| 2003/0132771 A1 | 7/2003 | Satoh et al. | |
| 2004/0005816 A1 | 1/2004 | Sato et al. | |
| 2004/0253845 A1 | 12/2004 | Brown et al. | |
| 2005/0106902 A1 | 5/2005 | Hougham et al. | |
| 2005/0181655 A1 | 8/2005 | Haba et al. | |
| 2006/0040519 A1 | 2/2006 | Arai et al. | |
| 2006/0238209 A1 | 10/2006 | Chen et al. | |
| 2007/0075717 A1 | 4/2007 | Kinghorn et al. | |
| 2007/0087588 A1 * | 4/2007 | Hougham et al. | 439/66 |
| 2007/0197099 A1 * | 8/2007 | DiStefano | 439/620.1 |
| 2007/0259539 A1 | 11/2007 | Brown et al. | |
| 2007/0298624 A1 | 12/2007 | Hougham et al. | |
| 2007/0298626 A1 * | 12/2007 | Hougham et al. | 439/66 |
| 2008/0003844 A1 | 1/2008 | Polnyi | |
| 2008/0003849 A1 * | 1/2008 | Cherian | 439/82 |
| 2008/0106280 A1 | 5/2008 | Chen et al. | |
| 2009/0181560 A1 | 7/2009 | Cherian | |
| 2010/0029100 A1 | 2/2010 | Ichimura et al. | |
| 2010/0065963 A1 | 3/2010 | Eldridge et al. | |
| 2010/0186714 A1 | 7/2010 | Bucci | |
| 2011/0111647 A1 | 5/2011 | Hougham et al. | |

* cited by examiner

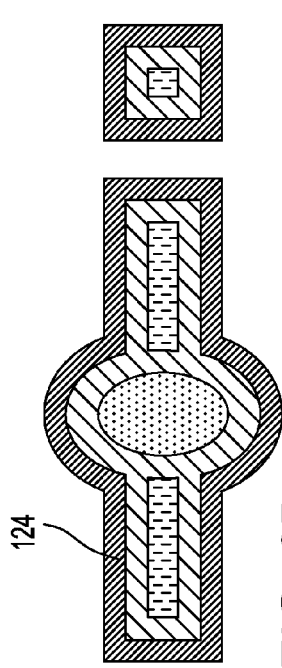
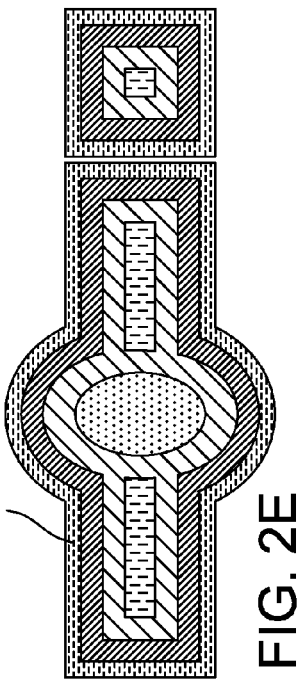
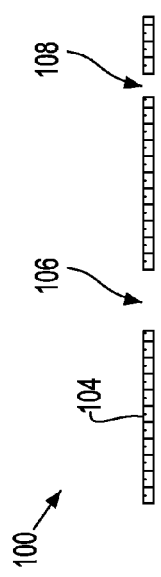
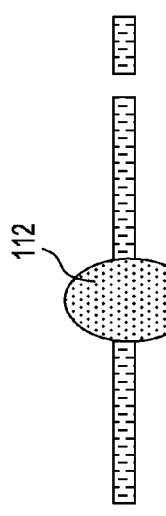
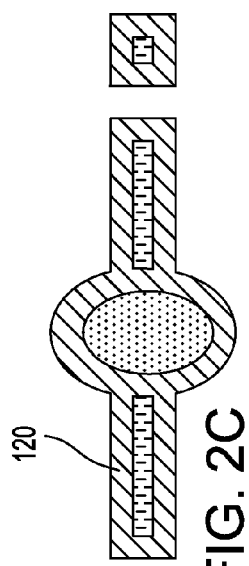

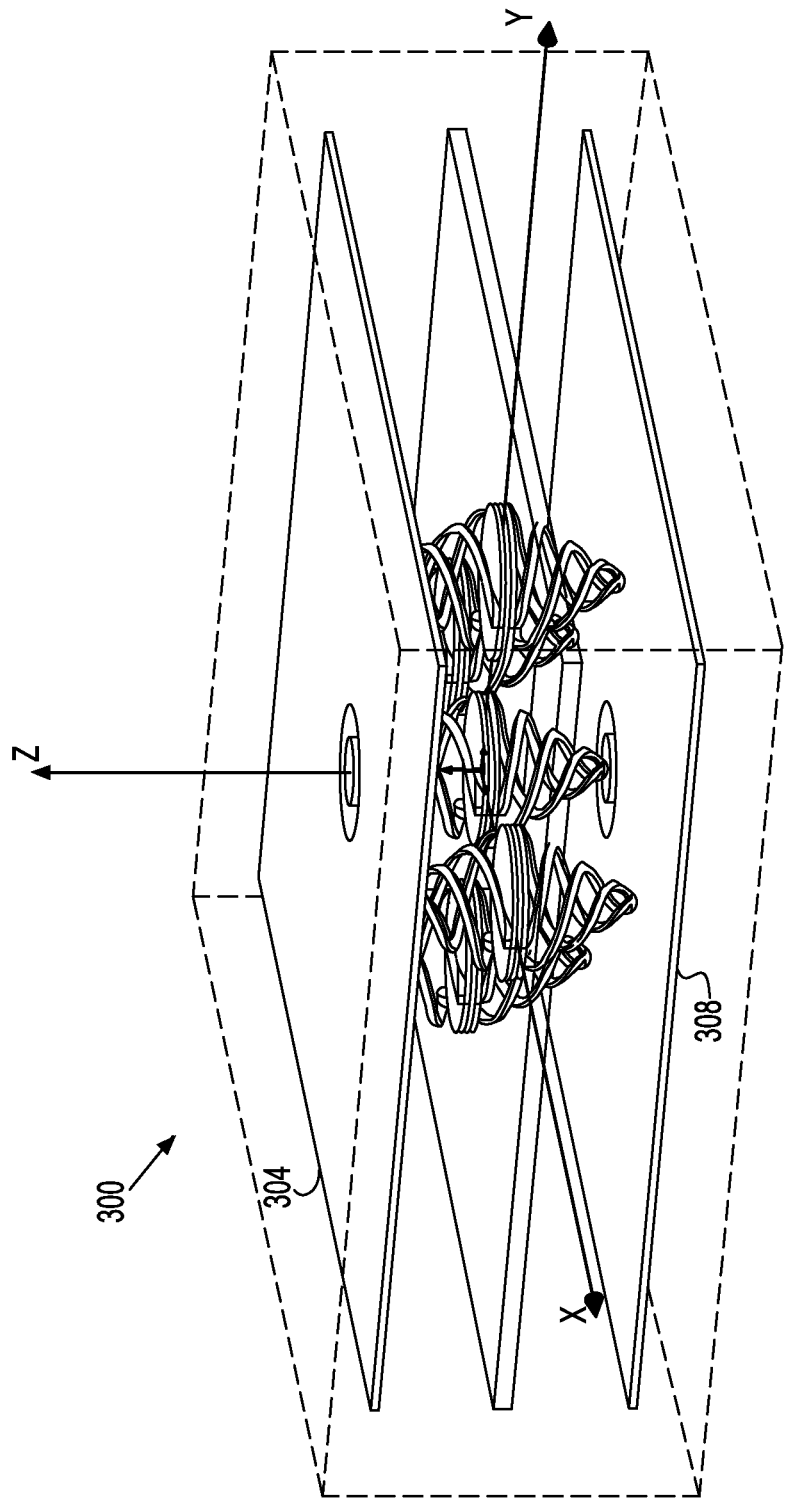

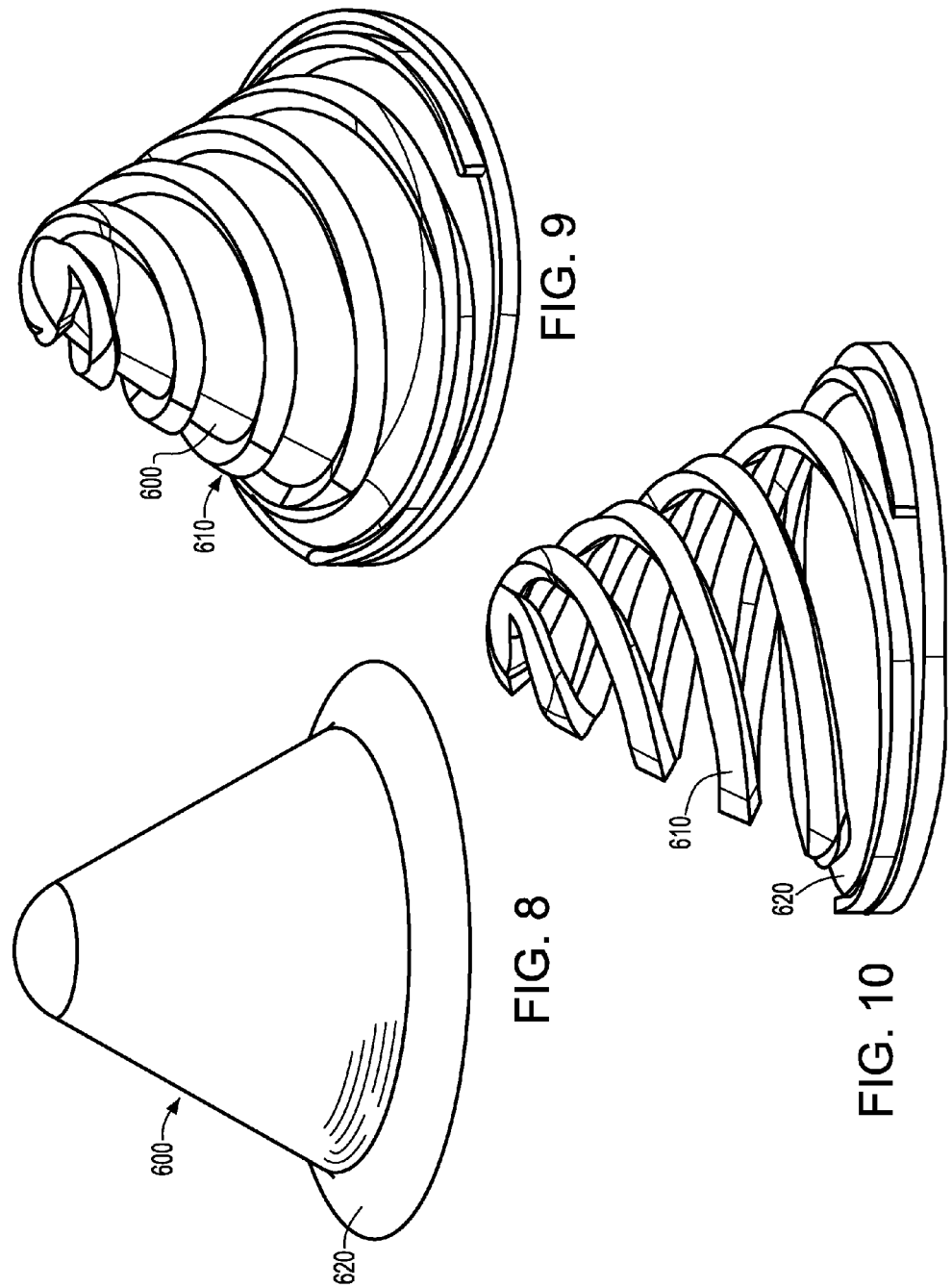

AXIOCENTRIC SCRUBBING LAND GRID ARRAY CONTACTS AND METHODS FOR FABRICATION

RELATED APPLICATIONS

This application is a divisional of U.S. application Ser. No. 12/614,224, now U.S. Pat. No. 8,263,879 filed Nov. 6, 2009.

CROSS REFERENCE TO RELATED APPLICATIONS

This application is a divisional of U.S. application Ser. No. 12/614,224, now U.S. Pat. No. 8,263,879.

This application is related to the following commonly-owned, co-pending United States Patent Application filed on even date herewith, the entire contents and disclosure of which is expressly incorporated by reference herein in its entirety: U.S. patent application Ser. No. 12/614,231, for "Metallurgical Clamshell Methods for Micro Land Grid Array Fabrication".

STATEMENT REGARDING FEDERALLY SPONSORED RESEARCH OF DEVELOPMENT

This invention was made with Government support under Contract No.: HR0011-07-9-0002 awarded by (DARPA) Defense Advanced Research Projects Agency. The Government has certain rights in this invention.

BACKGROUND

The present invention relates generally to the electrical contact structures in the field of microelectronics, and more particularly, relates to electrical contact structures and a method for manufacturing the same for microelectronics and semiconductor manufacturing.

Typical Land Grid Array (LGA) interconnects are 2-dimensional arrays of compliant electrical contacts that are sandwiched between two electrical devices, and pressed together to establish electrical contact. The application of force using hardware which surrounds both electrical devices provides the pressing together of the electrical devices. Primarily, varieties of LGAs include: 1. the geometry and constituent materials of the individual contacts; 2. the method of fabrication. The method of fabrication typically includes: 2a. one-shot array formation, i.e., molded or sheet stamped; and 2b. sequential placement of individual contacts to form an array. Example of known LGA fabrication techniques are disclosed in U.S. Pat. Nos. 7,331,796. 7,137,827, and 7,452, 212, all of which are commonly assigned with the instant application, and the subject matter of which are hereby incorporated by reference in their entirety.

However, decreasing the size of contact structures negatively affects mating of electrical contacts on each of the electrical devices being pressed together.

It would be desirable to provide an electrical contact structure and method for manufacturing the same which provides smaller scaling of the contact structure with increased contact between electrical contact structures.

BRIEF SUMMARY

In an aspect of the present invention, a contact structure for microelectronics includes first and second electrically conductive contacts having defined lengths, both the first and second contacts being helically shaped; and a carrier element attached to and positioned between the first and second contacts, the first and second contacts being in electrical communication with each other, and the first and second contacts being in a mirror image relationship with each other.

In a related aspect, the first contact is a right handed helix and the second contact is a left handed helix. In another related aspect, a pair of insulating substrates including electrically conductive members, and at least one contact point on each of the first and second contacts are attached to respective electrically conductive members. The first and second contacts may be symmetrical about a vertical axis bisecting the first and second contacts. The first and second contacts may be symmetrical about a horizontal axis bisecting the first and second contacts. A metal layer ma be on the carrier element providing electrical conductivity through a first opening defined by the carrier element between the first and second portions of the helix shaped contact. A second opening may be defined by the carrier element provides electrical conductivity through the second opening between the first and second portions of the helix shaped contact. In a further aspect, a pair of insulating substrates may include electrically conductive members, and at least one contact point on each of the first and second contacts are attached and electrically communicating to respective electrically conductive members such that the first and second electrically conductive contacts between the pair of insulating substrates form an electrically conductive package; and a metal layer on the carrier element provides electrical conductivity through a first opening defined by the carrier element between the first and second portions of the helix shaped contact; the first and second electrically conductive contacts between the pair of insulating substrates being in a compressed state relative to an at rest state; and a rotational displacement of the first and second contacts on the electrically conductive members between the compressed state and the at rest state.

In another aspect of the invention, a method for manufacturing a contact structure for microelectronics manufacturing comprises: providing a carrier element defining a first opening therethrough; positioning a molded element on opposite sides of the carrier element by passing the molded element partially through the first opening; coating the molded element with an electrically conductive material; fabricating a helix shaped contact from the electrically conductive material on the opposite sides of the carrier element, the helix shaped contact being positioned over the molded element, the helix shaped contact having a first portion and a second portion on the opposing sides of the carrier element, respectively, and the first and second portions being in mirror image relationship to each other; heating the combined helix shaped contact and the molded element such that the molded element is ablated and the helix shaped contact substantially retains the shape of the molded element.

In a related aspect, the helix shaped contact is a metal alloy; and the step of heating further includes: annealing the helix shaped contact; and quenching the helix shaped contact. The method may include the molded element as a molded sacrificial polymer element. The molded element may be cone shaped. The method may include: applying a plurality of conductive metal coatings to the conductive element. The step of fabricating the helix shaped contact may include using photolithography. A metal layer on the carrier element may provide electrical conductivity through the first opening between the first and second portions of the helix shaped contact. The method may include a second opening defined by the carrier element, and a metal layer on the carrier element providing electrical conductivity through the second opening between the first and second portions of the helix shaped contact. The method may include: positioning at least one contact point on each of the first and second contacts between a pair of insulating substrates including electrically conductive members; and positioning the at least one contact point on each of the first and second contacts to electrically communicate with respective electrically conductive members to form an electrically conductive package. The method may further comprise: compressing the first and second contacts between the insulating substrates such that the first and second contacts twist on the electrically conductive members during the compression.

In another aspect of the invention, a contact assembly for a microelectronics device, comprises: first and second electrically conductive contacts having defined lengths, both the first and second contacts being helically shaped; a carrier element attached to and positioned between the first and second contacts, the first and second contacts being in electrical communication with each other, and the first and second contacts being in a mirror image relationship with each other; a pair of insulating substrates each including electrically conductive members, and at least one contact point on each of the first and second contacts are attached and electrically communicating to respective electrically conductive members such that the first and second electrically conductive contacts between the pair of insulating substrates form an electrically conductive package; and a metal layer on the carrier element provides electrical conductivity through a first opening defined by the carrier element between the first and second portions of the helix shaped contact.

In a related aspect, a second opening defined by the carrier element provides electrical conductivity through the second opening between the first and second portions of the helix shaped contact. The assembly may further comprise: the first and second electrically conductive contacts between the pair of insulating substrates being in a compressed state relative to an at rest state; and a rotational displacement of the first and second contacts on the electrically conductive members between the compressed state and the at rest state.

In another aspect of the invention, a process for manufacturing a contact structure for microelectronics manufacturing, comprises: positioning a molded element having a specified geometric shape on a carrier element; sequentially coating the molded element with a plurality of electrically conductive materials; coating the molded element with a layer of photoresist; fabricating a contact from the electrically conductive materials on the carrier element using photolithography and etching, the contact being positioned over the molded element; and heating the contact and the molded element such that the molded element is ablated and the contact retains the shape of the molded element. The contact may be a helix shaped contact.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 2A-2I are diagrammatic view of process steps depicting the process for manufacturing a hollow LGA array according to an embodiment of the invention;

FIG. 4 is a perspective view of a plurality of helical contacts used in high frequency electrical simulation;

FIG. 8 is an isometric view of a single side of a molded sacrificial polymer element;

FIG. 9 is an isometric view of the element shown in FIG. 8, having a metal helix spring contact formed over the element;

FIG. 10 is an isometric view of the spring contact of FIG. 9 after the sacrificial polymer element shown in FIGS. 8 and 9 has been ablated;

DETAILED DESCRIPTION

Figure 1:
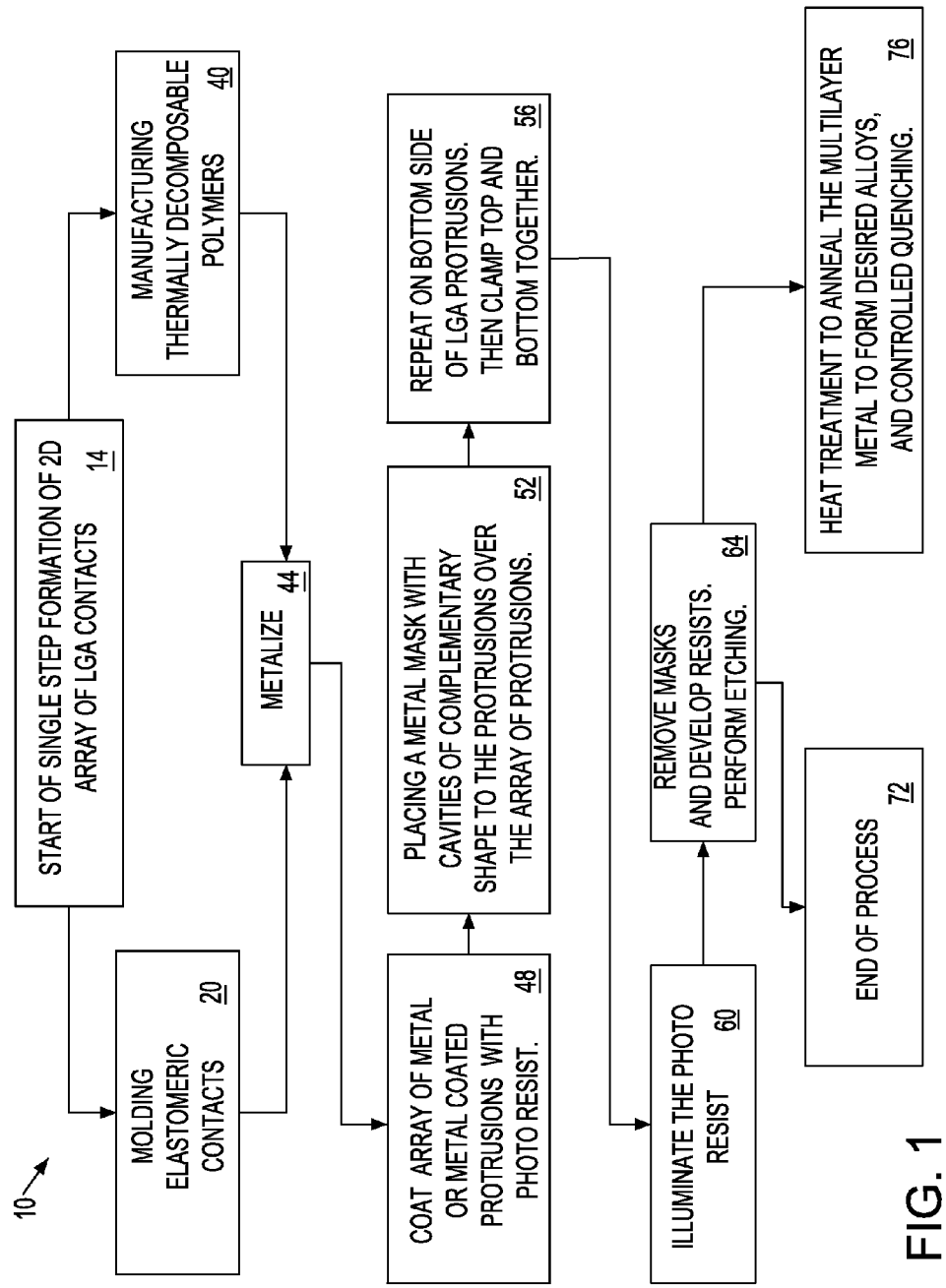
FIG. 1 is flow chart of a method of the invention according to one embodiment of the invention.

Referring to FIG. 1, a method 10 according to one embodiment of the present invention includes the general steps below including step 14 forming a substrate with a 2d array of vias (for example, conducting vias) as a first step to forming a 2d array of contacts. Two different alternatives can be pursued after step 14, a first path is to manufacture contacts shaped from thermally decomposable polymers in step 40. Contact elements are shaped from thermally decomposable polymers, and the sacrificial polymers are molded into a carrier plane with vias. The plurality of contact may be formed in an array of contacts having a pattern.

A second path is to mold elastomeric contact elements into a carrier plane in step 20. After either steps 20 or 40, the contact elements are metalized using known methods in step 44. Both paths continue in step 48 wherein the protruding contact elements are coated with metal layers and photo resist. A conformally coating resist such as electrophoretically deposited photo resist is used to coat the protruding contacts.

A metal mask for positioning over both sides of the LGA protrusions includes cavities of complementary shape to the protrusions and is placed over an array of protrusions in step 52. The cavities are of similar shape to a desired contacts, but slightly larger to account for the photo resist thickness and any tolerance. The masks have patterns in the top formed as slots by wire electric discharge machining (EDM), laser, and other techniques. The patterns transmit light into a pattern onto the photo resist covered contacts or LGA protrusions, without allowing for significant reflections from one contact to another because they are nestled into individual cavities.

Then the metal mask is clamped together, e.g., top and bottom portions of the metal mask can be clamped together.

Figure 2H:
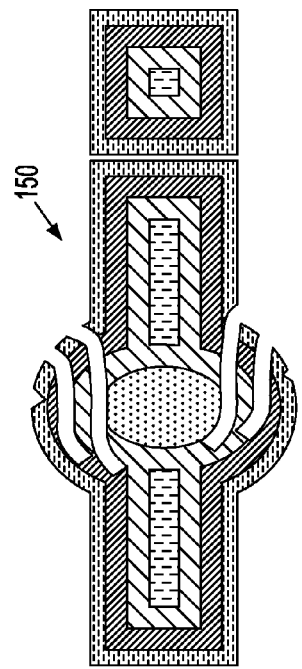

Referring to FIG. 2, a process 100 for manufacturing hollow LGA array using a mold includes a perforated insulator 104 as shown in FIG. 2A. The perforated insulator 104 includes a large hole 106 and a small hole 108. A polymer element 112 shown in FIG. 2B is oval shaped, however, other shapes may be used. A desired radius lip 620 shown in FIGS. 5 and 8 transitions from the polymer element to the substrate surface and is formed where the polymer contacts the substrate 408 in FIG. 5. The polymer element 112 is molded into the perforation or hole 106. A metal layer 120 is formed over the insulator 104 as shown in FIG. 2C, metalizing, for example, with copper (for example, 12.5 micrometers (um) thick). Another layer 124 is added over the metal layer 120. The layer 124, for example, can be beryllium about 2.5 microns thick. Another metal layer 128, for instance a copper layer of about 12.5 um, is formed over the Be layer 124 in FIG. 2E. Onto this metal stack is deposited a photo resist 132 shown in FIG. 2F. The photoresist may be a conformal coating obtainable with electrophoretic resist. The metal stack with photo resist is referred to as a sample 136, and is inserted between a form fitting top layer mask 140 and a form fitting bottom layer mask 142 as shown in FIG. 2G. Machined fine slots shown as curved and straight thin lines 148 in the body of masks 140 and 142 of FIG. 2G are cut into the masks 140, 142 to define the pattern of light that will be able to penetrate to the metal stack with photo resist. A helical pattern is projected onto the metal stack with photo resist, and a linear strip is patterned leading to a via to the right of the polymer bump 112 which will act as an electrical conduit through the hole 108 to connect the final product of contact structure embodied as top and bottom helical springs 160 shown in FIG. 2I. After the sample 136 has been removed from the mask 140, 142, the resist 132 developed, and the exposed metal etched away the pre-finished part 150 includes metal remaining only where it is desired for manufacturing the final part. The pre-finished part 150 includes the polymer bump 112, and the metal coating remaining in discrete layers 120, 124, 128. Fabricating the 3D masks 140, 142 utilized in process step 2G may use fine wire EDM, laser cutting, plasma cutting, water jet cutting, all in combination with any standard machining that may also be required.

Figure 2I:
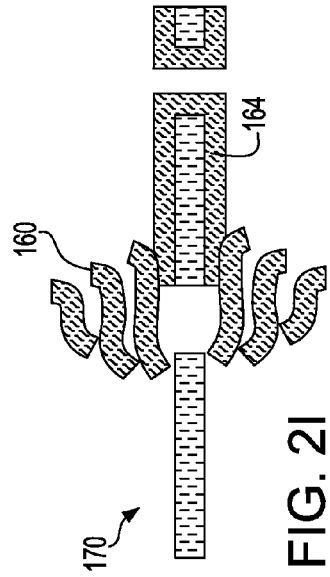
Figure 2F:
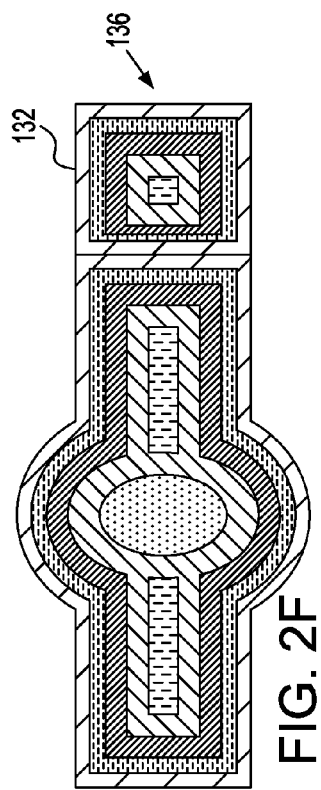
Figure 2G:
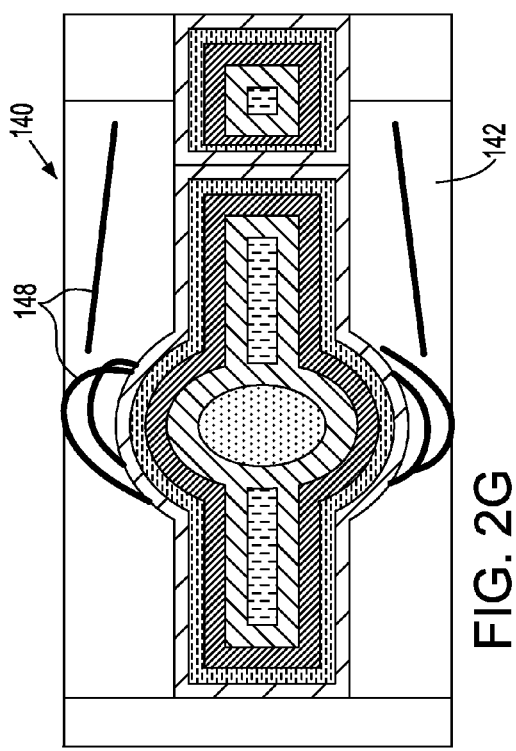

Referring to FIG. 2I, a high temperature bake out and anneal is performed in inert or chemically reducing gas environment during which the polymer 112 is decomposed and the metal layers 120, 124, 128 diffuse into one another forming a single metal alloy layer 164. Upon cooling or quenching at a speed chosen to give the desired metallurgical microstructure (which varies from a sudden liquid nitrogen quench 10 deg. C/second, to a slow cool of 1 deg. C/day) the final contact structure 170 is formed as shown in FIG. 2I. The contact structure 170 includes the original insulator 104 and the double sided spring contact 160 which is electrically connected through the central plane by the single metal allow layer 164 via the small hole 108.

Figure 3A:
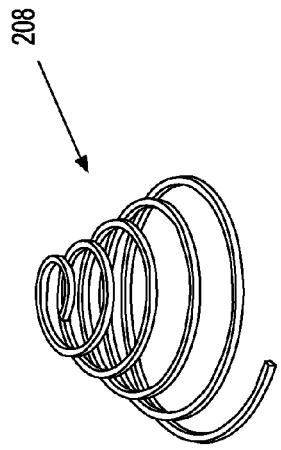
FIGS. 3A-3B are perspective views of helical contacts in reverse directions.
Figure 3B:
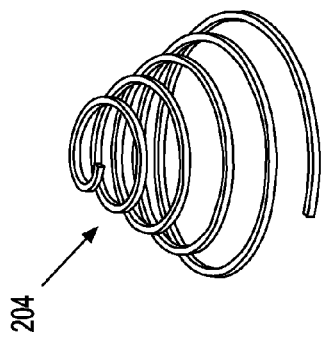
Figure 3C:
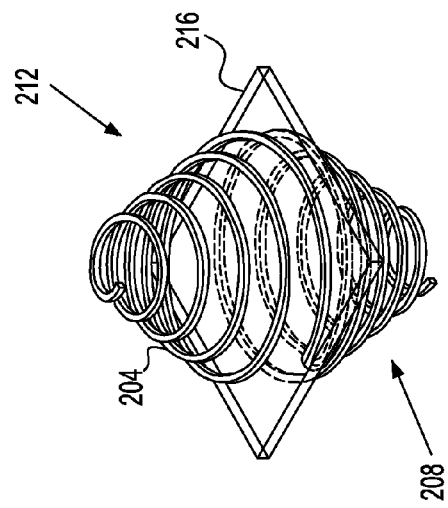
FIG. 3C is a side elevational view of a contact assembly having helical contact in mirror image relation separated by a carrier element.
Figure 3D:
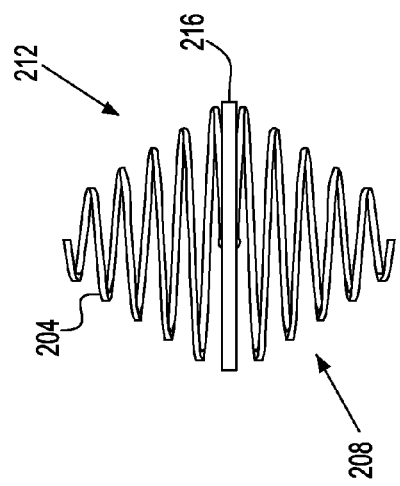
FIG. 3D is a perspective view of the contact assembly in FIG. 3C.

Referring to FIGS. 3A and 3B, two LGA helical spring contacts are shown. A right handed helical contact 204 extending in the clockwise direction is shown in FIG. 3A. A left handed helical contact 208 extending in the counter clockwise direction is shown in FIG. 3B. Referring to FIGS. 3C and 3D, a contact assembly 212 includes a right handed helical contact 204 in mirror image relation with a left handed helical contact 208 having a carrier element 216 therebetween. The mirror image relation of the right handed and left handed helical contacts 204, 208, respectively, or helix reversal, imparts to a signal performance enhancements of the contacts at high frequencies.

Referring to FIG. 4, a plurality of helical contact assemblies 212 (as shown in FIG. 3C,) including right hand and left hand wind directions as described regarding FIG. 3C, are used in a package 300. The package 300 includes the contact assemblies 212 between upper and lower substrates 304, 308, respectively. The package 300 provides helical contact assemblies 212 for a high frequency electrical applications.

Figure 5:
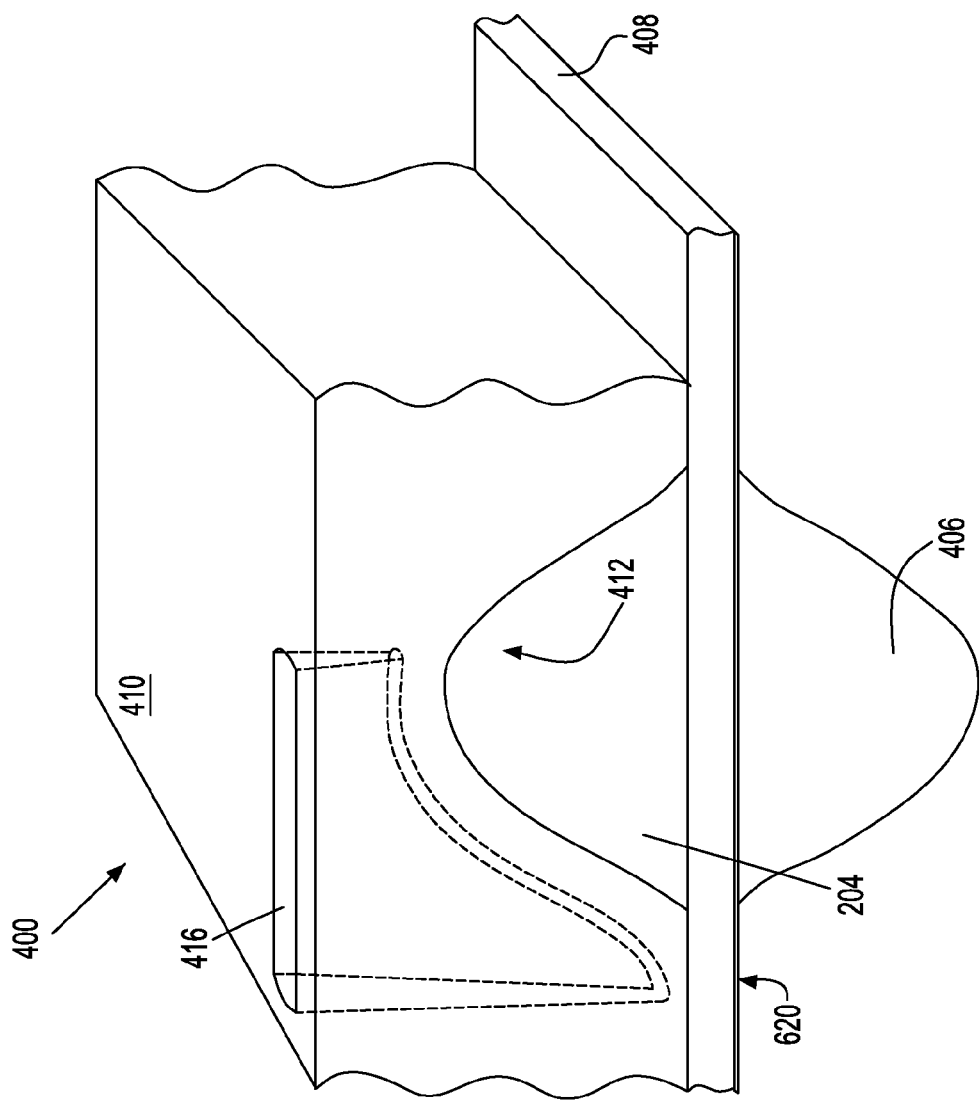
FIG. 5 is a perspective view of an illustrative metal and photo resist coated molded polymer bump sitting within a form fitting cavity.

Referring to FIG. 5, an illustrative mask and polymer bump combination 400 includes a metal and photo resist coated molded polymer bump having a top portion 404 and a bottom portion 406 separated by a substrate 408. The bump sits within a form fitting cavity 412 of a top portion of a mask solid 410. The mask solid 410 includes a pattern 416 open to the outside. This example shows a slot pattern 416, however, other patterns including multileg helix patterns can be used. A bottom portion of the mask (not shown) typically is clamped together with the top portion 410. The closed mask solid is rotated and illuminated to provide light access through the slot pattern 416, producing the desired image on the bump 404, 406.

Figure 7:
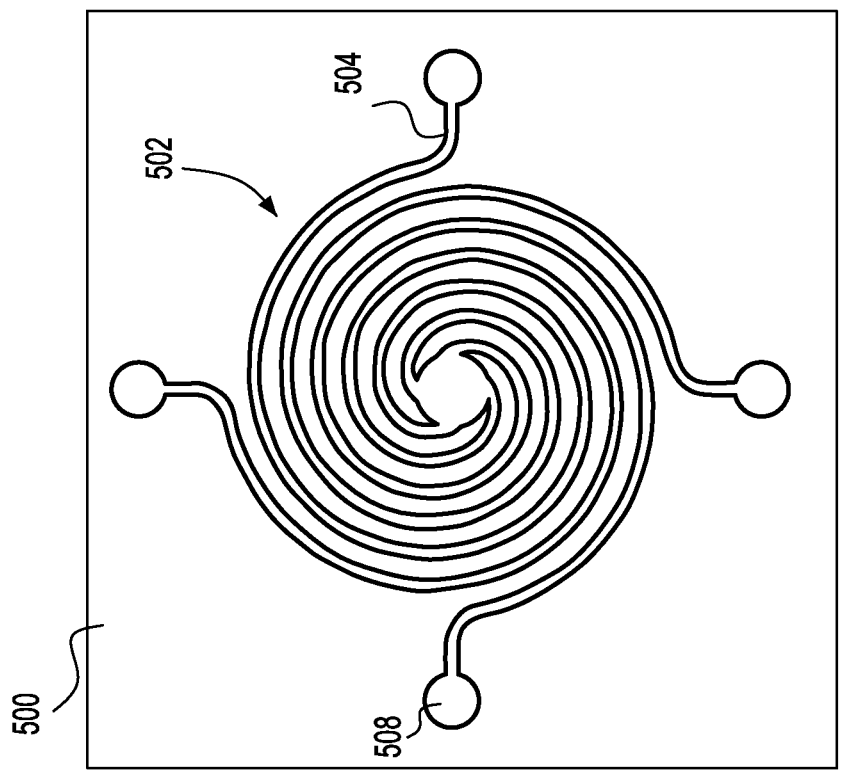
FIG. 7 is a isometric bottom view of the mask pattern shown in FIG. 6.
Figure 6:
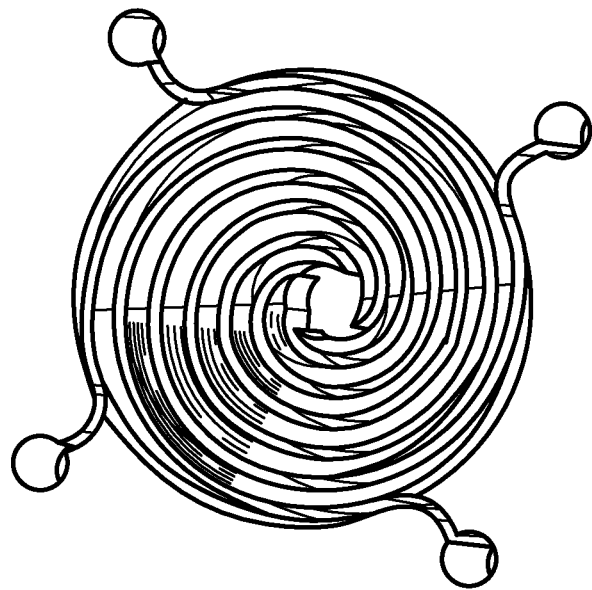
FIG. 6 is a plan view of a mask pattern shaped as a four leg helix.

Referring to FIGS. 6 and 7, a mask 500, is cut out of metal, and the pattern is cut out from the mask 500 as a four legged 504 helix pattern 502. The helix pattern 502 allows light to pass through the cut away portions as shown in FIG. 6. The helix pattern 502 includes the four legs 502 having circular pads 508.

Referring to FIG. 8, a single side of a molded sacrificial polymer element 600 is frustoconically shaped. The element, as used in the embodiments of the invention depicted herein, are two sided, i.e., having two elements 600 in opposing relation such that the element 600 is joined through a perforation in a center carrier.

Referring to FIG. 9, an intermediate fabrication step includes molded polymer element 600 under a lithographically formed metal helix spring contact 610. The helix spring contact 610 comprises different layers of metal (not shown) that will ultimately form an alloy after heat treatment and quenching in later processing.

Referring to FIG. 10, the spring contact 610 shown in FIG. 9 is shown after a fabrication heating step wherein the sacrificial polymer element has been ablated (burned out or vaporized or other wise decomposed) and metal layers have been annealed to form alloy, and then the contact 610 is quenched to achieve the final metallurgy. Also shown is a conducting metal baseplate 620 which may be used in some instances to form mechanical anchoring of the helix legs and to electrically connect top and bottom sides of the contact 610. The baseplate 620 may be use instead of, or in addition to, a conductive element connecting the contact through a separate via as shown in FIG. 2.

Figure 11:
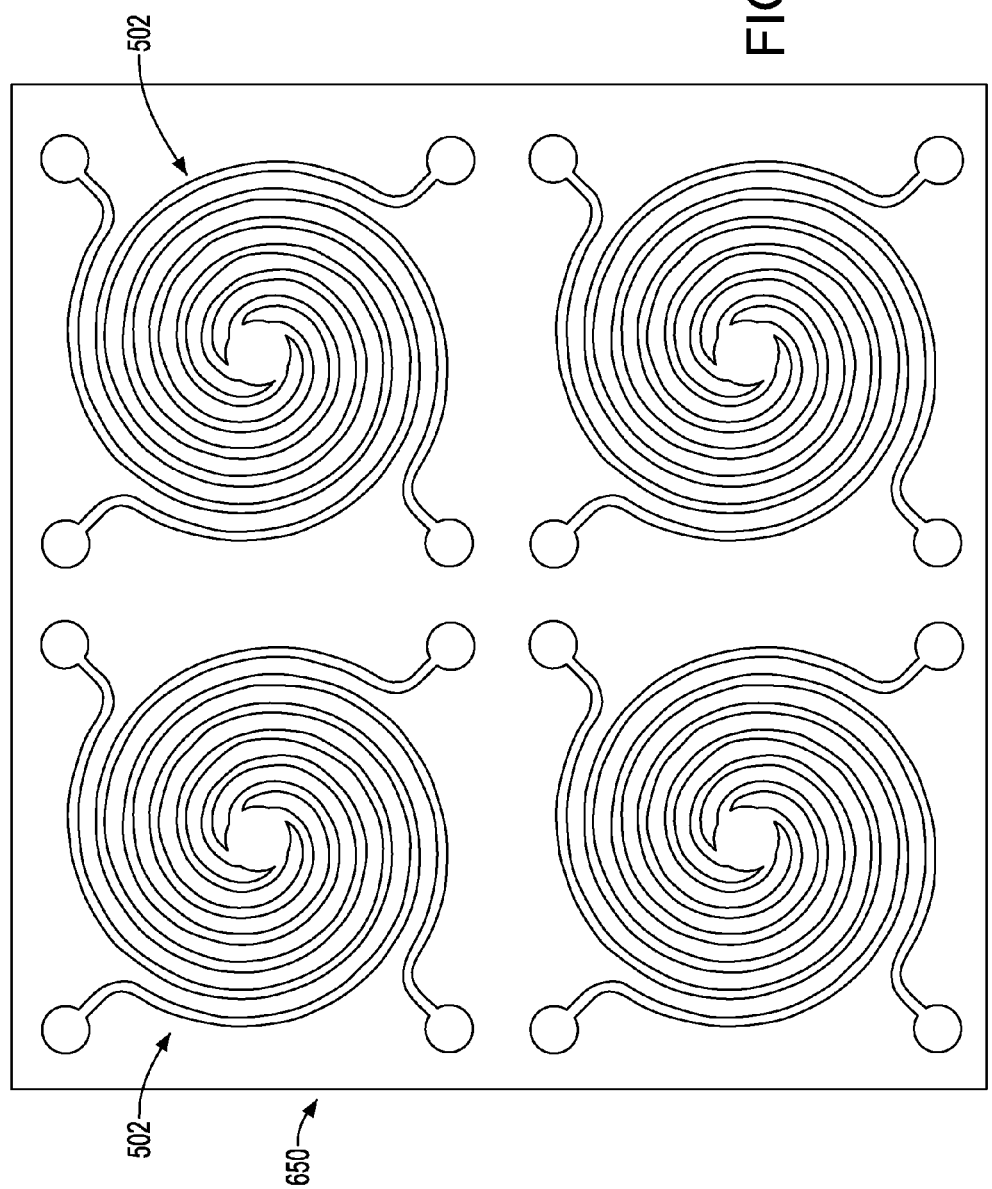
FIG. 11 is a plan view of a group of four mask pattern openings in a helix pattern.
Figure 12:
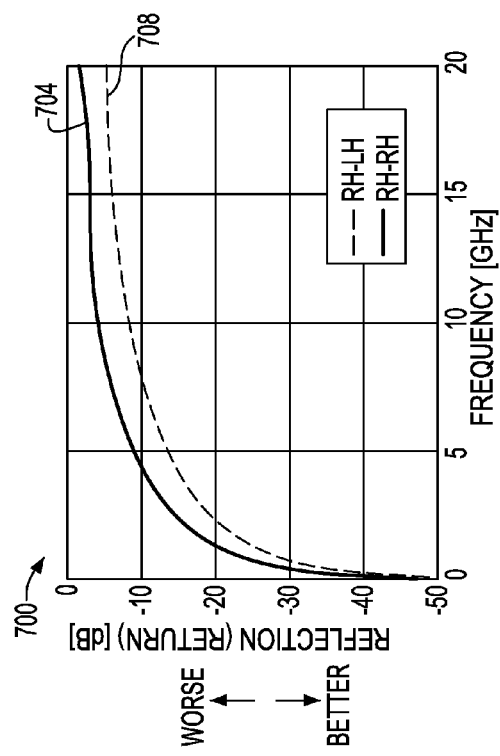
FIG. 12 is a graph of a return loss in dB (reflected energy) for right hand-left hand (RH-LH) and right hand-right hand (RH-RH) spring contact types.
Figure 13:
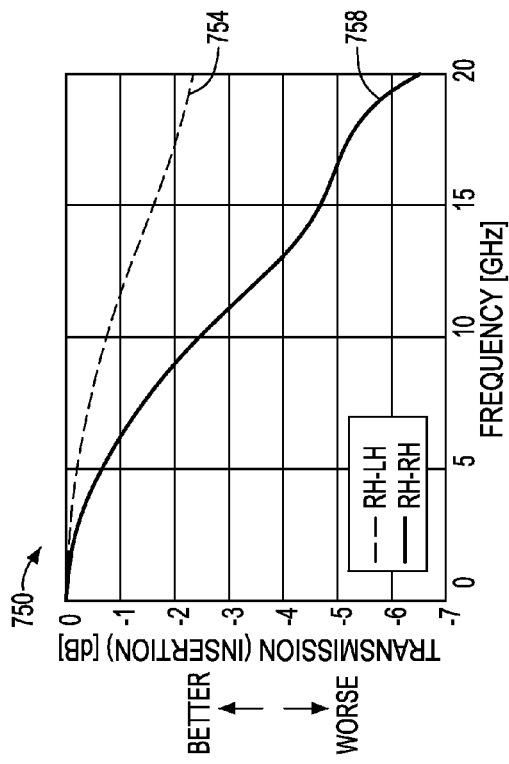
FIG. 13 is a graph of effects of spring contact leg rotation on electrical transmissive loss performance.

Referring to FIG. 11, a metal mask 650 includes a plurality of metal helix spring contacts 502 in a pattern on the metal mask 650. In an alternative embodiment, a large plurality of contact 502 may be patterned on a metal mask, for example, hundreds or thousands of contacts to form a desired array of contacts Referring to FIG. 12, a graph 700 of return loss in dB (reflected energy) for right handed-right handed (RH-RH) 704 and right handed-left handed (RH-LH) 708 spring contacts is shown. The graph 700 shows much lower reflective losses for RH-LH spring contacts even at relatively low frequencies. Referring to FIG. 13, a graph 750 of effects of spring contact leg rotation on electrical transmissive insertion loss performance is shown. RH-RH 758 is shown to have a more severe insertion loss than RH-LH 754. This becomes especially pronounced above frequency of 5 GHz.

More specifically, the electrical performance of the helical contacts are illustrated in terms of their scattering parameters up to 20 GHz with ports defined at the top and the bottom of the contact. The reflection (referred as return) shown in FIG. 12 of the RH-LH type of contact is smaller than the RH-RH type, meaning less energy gets reflected when the signal propagates vertically through the contact. On the other hand, the transmission (referred as insertion), shown in FIG. 13, of the RH-LH type of contact is larger than the RH-RH type, indicating more energy gets transmitted through the contact. Both graphs/plots 700, 750 consistently demonstrate that the RH-LH type of contact has superior electrical performance to the RH-RH type in terms of signal integrity for high-speed signals.

Thereby the present invention provides helical spring positioned in mirror image relation to each other. For example, a contact structure comprised of two helical springs that are mirror images of each other across the plane defined by a central carrier. Further, referring to FIGS. 2A-2I, the present invention provides a process including the steps of: molding polymer template of LGA contacts into the top and bottom of an insulating carrier plane; metalizing over the polymer; coating with photo resist, preferably electrophoretic or other type of conformal coating method; sandwiching the metalized molded polymer LGA within a carrier between top and bottom 3D masks; photoexposing; removing LGA from mask, and completing the lithography; and heat treating the sample to burn away (cleanly vaporize) polymer template leaving hollow contact and complete the alloying of constituent metals.

In another embodiment of the invention similar to the process shown in FIGS. 2A-2I, however, the process uses elastomeric molded contacts instead of polymers meant to decompose, and eliminates the high temperature burn out step.

The present invention achieves a rotational or twisting effect of the helical contacts. This rotation upon compression is desirable to achieve scrubbing through oxide and other thin contaminant layers normally present on electronic contacts. A feature of these helical electrical contact structures is that the direction of helicity reverses as it passes through the central carrier plane, i.e. that the top and bottom helix structures are mirror images with respect to the carrier plane. This preserves the signal integrity of a computer signal at high frequencies by causing significant cancellation of electromagnetic induction.

The advantage of having a rotational scrubbing over typical lateral scrubbing is that as xy dimensions of LGA arrays are decreased, traditional lateral scrubbing increases the chance of the contact moving off the mating contact pad and resulting in an open circuit. Rotational scrubbing of an axiosymmetric contact does not move the contact relative to the position of the mating surface pad, and thus reduces the chances of a contact moving off a mating contact pad.

Additionally, metalization over a polymer, may include the methods for metalizing including electroplating, electro less plating, physical vapor deposition such as meal evaporation or sputtering, chemical vapor deposition, plasma spray, powder coating, etc. The metalizing could be a single layer or multiple layers of different metals.

In addition, coating with a photo resist, may include electrophoretic or other type of conformal coating method. The extreme z-dimension of LGA contacts complicates photolithography processes in several ways. In order to apply photo resist uniformly, one alternative is to use electrophoretic type photo resists. Electrophoretic resist may be used to provide uniform coverage of photo resist. Other methods of photo resist coating include spraying, spinning and liquid dipping.

3D Masks are used to expose all coated surface with a uniform dose of light using the photo resist coated LGA pre-contacts inserted into form fitting cavities on the underside of a mask. The desired contact pattern is then cut into the top of the mask using a very fine resolution machining technique called wire EDM (electro discharge machining). The LGA precontact protrusions on both sides of a carrier plane are accordingly inserted into masks in a sandwich form. Thus, the part can be illuminated and photo lithographically defined from both sides. 3D masks include a plate of metal where the bottom has machined cavities that are form fitting to the metalized and photo resist coated LGA contact arrays. In practical application the cavities need to be a little bigger in dimension than the coated LGA contacts to account for any fabrication tolerances etc.

The final desired contact pattern is imparted to the mask by cutting or etching light pathways, or slots by wire EDM (wire electrodeposition machining) using very fine cutting wires. Alternatively, slots can be made by laser cutting, chemical etching, plasma etching etc. This slotting is expected to be most practically exercised cutting at right angle to the plane of the mask, i.e., through the z-direction of the mask metal. However, it can be advantageous to cut in a direction at right angles (normal) to the surface of the contact at any given location along the contact. Such normal-to-surface (NTS) slotting allow superior lithographic resolution and superior illumination uniformity. This process may be combined with chemical etching to achieve slot cuts of desired geometry.

During photoexposure the entire part and mask sandwich assembly is tilted and rotated to affect as uniform a photoexposure as possible. This is most easily accomplished by moving the assembly with rotation and tilt stages programmed to move through a path optimal for a given contact pattern. Alternatively, the light source can be made to move around the part. Alternatively, the light source can be shaped by holographic and other types of lenses to provide a uniform distribution of light from many directions at once. Once the lithography is completed, the LGA can be removed from the mask sandwich, and lithography steps of developing resist and etching metal into desired pattern are completed.

To obtain hollow contacts by cleanly burning or vaporizing away the polymer protrusions, e.g., the sacrificial polymer, heat is used, and also causes diffusion of multi layers of deposited metal into one another so they form alloys. Other methods of removing the temporary polymer bump, such as by chemical dissolving may be used.

In an alternative embodiment of the present invention, metal on elastomer contacts are formed using steps of 2A-2E shown in FIG. 2 on molded elastomeric protrusions (bumps) rather than those made with sacrificial polymer. In this case, the metal will be left on the elastomer bump and used as part of the final contact.

In an alternative embodiment, a process includes depositing constituent metal layers over the sacrificial polymer protrusions. For instance, to make a thin film copper beryllium contact the contact may consist of variable Cu to Be ratios depending on the final properties desired. Alternatively, for example, electroplating 12.50 μm copper, then sputter deposit 2.5 μm of Beryllium, followed by the deposition of a second layer of 12.5 μm copper. This metal deposition would be followed by coating with photo resist (e.g. electrophoretic photo resist) and would be sandwiched into 3D egg carton like mask and exposed to light (e.g. Ultraviolet). The part would then be removed from the mask, the photo resist developed to remove protection from any metal desired to be removed. The unprotected areas of the metal would then be etched away. The part is then heated in an oven at sufficiently high temperatures and long enough period of time for the metals to diffuse together to form the alloy of interest after cooling at appropriate rates to obtain the temper of interest by controlled quenching. In this example, Cu and Be would need temperatures of 850 degrees C. for about an hour to diffuse (see Table 1 below). In the heating process the sacrificial polymer protrusions would have burned away and the remaining photo resist will have burned away (or could be removed chemically after the etching).

Table 1 shows the calculated time for a three-layer thin film (12.5 micron Cu/2.5 micron Be/12.5 micron Cu) to completely diffuse into one another. This informs us that if these three materials were sequentially deposited onto the sacrificial polymer, that heating to 850 deg. C. would be required to achieve diffusion within one hour in a furnace, and that a temperature of 1000 deg. C. would be required to shorten the time to 6 minutes. Once homogeneously dispersed, the attainment of desired mechanical properties requires controlled cooling to facilitate desired precipitation and achieve desired metallurgical microstructure.

TABLE 1

| Temp C. | time (h)* |
|---|---|
| 400 | 1040042.8 |
| 425 | 296942.0 |
| 450 | 92456.9 |
| 475 | 31122.9 |
| 500 | 11241.0 |
| 525 | 4327.6 |
| 550 | 1765.5 |
| 575 | 759.4 |
| 600 | 342.8 |
| 625 | 161.7 |
| 650 | 79.5 |
| 675 | 40.6 |
| 700 | 21.4 |
| 750 | 6.6 |
| 800 | 2.2 |
| 850 | 0.8 |
| 900 | 0.3 |
| 950 | 0.2 |
| 1000 | 0.1 |

Further, alloys other than BeCu can be made using the above technique, such as Ni into Copper, which would take 3.3 hours at 1000 C. Other varieties of metal combinations of two or more constituent metals could be achieved in this way in the desired contoured shape.

The methods according to the present invention are applicable to any combination of metals including bi-metal alloys, ternary alloys, as well as any number of metals together to create an alloy. Other metals may be present, incidentally, for example, from adding adhesions layers, such as titanium and chromium.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for manufacturing a contact structure for microelectronics manufacturing, comprising:

providing a carrier element defining a first opening therethrough;

positioning a molded element on opposite sides of the carrier element by passing the molded element partially through the first opening;

coating the molded element with an electrically conductive material;

fabricating a helix shaped contact from the electrically conductive material on the opposite sides of the carrier element, the helix shaped contact being positioned over the molded element, the helix shaped contact having a first portion and a second portion on the opposing sides of the carrier element, respectively, and the first and second portions being in minor image relationship to each other;

heating the combined helix shaped contact and the molded element such that the molded element is ablated and the helix shaped contact substantially retains the shape of the molded element;

positioning at least one contact point on each of the first contact portion and the second contact portion between a pair of insulating substrates including electrically conductive members; and positioning the at least one contact point on each of the first and second contacts portions for electrical contact with respective electrically conductive members to form an electrically conductive package.

2. The method of claim 1, wherein the helix shaped contact is a metal alloy; and the step of heating further includes:
annealing the helix shaped contact; and
quenching the helix shaped contact.

3. The method of claim 1, wherein the molded element is a molded sacrificial polymer element.

4. The method of claim 1, wherein the molded element is cone shaped.

5. The method of claim 1, further comprising:
applying a plurality of conductive metal coatings to the molded element.

6. The method of claim 1, wherein fabricating the helix shaped contact includes using photolithography.

7. The method of claim 1, wherein a metal layer on the carrier element provides electrical conductivity through the first opening between the first and second portions of the helix shaped contact.

8. The method of claim 1, further comprising:
a second opening defined by the carrier element, and a metal layer on the carrier element providing electrical conductivity through the second opening between the first and second portions of the helix shaped contact.

9. The method of claim 1, further comprising:
compressing the first and second contacts between the insulating substrates such that the first and second contacts twist on the electrically conductive members during the compression.

10. The method of claim 1, further comprising:
sputter depositing the electrically conductive material.

11. The method of claim 10, wherein the electrically conductive material comprises copper and beryllium.

12. The method of claim 10, wherein the electrically conductive material is formed from a plurality of layers using the sputter depositing step.

13. The method of claim 12, wherein the electrically conductive material comprises one or more combinations of the elements in the following groups: (beryllium, copper, and titanium); and (beryllium, copper, and chromium).

14. The method of claim 13, wherein a specified number of the plurality of layers are copper, and another specified number of the plurality of layers are beryllium.

15. The method of claim 1, further comprising:
depositing the electrically conductive material using one of the following deposition techniques:
electroplating; evaporation; plasma spray; electroless deposition; and sputter deposition.

16. The method of claim 15, wherein the step of depositing the electrically conductive material includes depositing a plurality of layers to form the electrically conductive material; and the method further comprising, before the step of heating the combined helix shaped contact, the following step:
implementing one or more of the deposition techniques including any combination of the deposition techniques, with one or more of the following materials including any combination of the materials, including: copper; beryllium; titanium; and chromium.

* * * * *